United States Patent [19]
Golla et al.

[11] Patent Number: 5,687,124
[45] Date of Patent: Nov. 11, 1997

[54] CIRCUIT FOR IDENTIFYING A MEMORY CELL HAVING ERRONEOUS DATA STORED THEREIN

[75] Inventors: Carla Golla, Milan; Silvia Padoan, Forli; Luigi Pascucci, Milan, all of Italy

[73] Assignee: SGS-Thomson Microelectronics S.r.l., Agrate Brianza, Italy

[21] Appl. No.: 521,304

[22] Filed: Aug. 30, 1995

[30] Foreign Application Priority Data

Aug. 31, 1994 [EP] European Pat. Off. ............ 94830412

[51] Int. Cl.$^6$ ...................................................... G11C 7/00
[52] U.S. Cl. ............... 365/200; 365/189.07; 365/189.08; 365/185.09; 365/185.33
[58] Field of Search ........................... 365/200, 189.07, 365/189.08, 185.04, 185.09, 185.33; 371/67.1

[56] References Cited

U.S. PATENT DOCUMENTS

| | | | |
|---|---|---|---|
| 4,475,194 | 10/1984 | LaVallee et al. | 365/200 |
| 5,287,326 | 2/1994 | Hirata | 365/230.03 |

FOREIGN PATENT DOCUMENTS

| | | |
|---|---|---|
| 2 264 578 | 9/1993 | United Kingdom. |
| WO90/12400 | 10/1990 | WIPO. |

Primary Examiner—David C. Nelms
Assistant Examiner—Trong Quang Phan
Attorney, Agent, or Firm—David V. Carlson; Seed and Berry LLP

[57] ABSTRACT

A circuit for selectively programming a single bit in non-volatile memory is disclosed. The circuit consists of at least one comparator, at least one transistor, and at least one logic gate for each elementary memory in the memory word. In operation, the circuit allows for individual correction of mis-programmed cells within the memory by comparing the actual contents of the memory with the desired contents. If the actual contents does not match the desired contents, that individual cell is re-programmed.

18 Claims, 2 Drawing Sheets

CIRCUIT FOR IDENTIFYING A MEMORY CELL HAVING ERRONEOUS DATA STORED THEREIN

TECHNICAL FIELD

This invention relates generally to electronic devices and more specifically to a circuit for single-bit programming of a memory word of an electronic non-volatile memory device.

In particular, the invention concerns a circuit of the above type and which comprises, for each elementary memory cell included in said word, at least one comparator having a first input connected after a read circuit for reading the contents of said word and a second input which receives a data corresponding to a bit to be stored into said word.

BACKGROUND OF THE INVENTION

As is well known, a non-volatile memory circuit integrated into a semiconductor device comprises quite a large number of memory cells. The cells are substantially arranged into a matrix with a plurality of rows (word lines) and columns (bit lines).

To program any given cell, its position must be selected along the word line and the bit line which identify it, and appropriate positive voltage values must be applied to the terminals of that cell.

The memory cells, which are addressed simultaneously at the programming stage, usually form a byte, comprising eight bits, or a memory word (word) comprising one or more bytes.

In fairly complex electronic devices, such as non-volatile memories of the "Flash" type, each programming cycle includes a first proper programming step and a second testing step.

In essence, to make sure of a successful storing operation, a first word programming is performed, followed by a so-called program verify step, i.e., a step for testing that the individual bits have actually been programmed.

The program verify step consists of comparing the contents of the memory cells, addressed by byte or by word, to signals stored in data registers and including the data that were indeed to be programmed.

At the current state of the art, when the comparison reveals that the contents of the addressed byte (or word) is different from the external data set, a further program pulse must be triggered to the memory word.

In such non-infrequent cases, the difference between the stored data and the data set may amount to no more than a single bit within a byte or a word.

In this context, a demand would exist for this additional program pulse to be only supplied to the bit that failed the comparison, not to a whole group of addressed cells, so to avoid subjecting them once more and unnecessarily to the relatively high programming voltage.

In doing so, already programmed bits would be spared unnecessary stressing, thereby improving their allotted life span.

However, no proposals have been advanced heretofore by the prior art to provide circuit arrangements which can fill this demand in an effective and efficient way.

SUMMARY OF THE INVENTION

An object of this invention is to provide a verify circuit for the programming of a group of memory cells, which circuit allows re-programming within the cells of just those bits which have failed the comparison to the data to be stored, thereby overcoming the limitations which beset prior art circuits.

The solutive idea on which aspects of this invention stand is that of structuring the programming, verifying and re-programming circuit to include a comparator and a logic network whose output only happens to be high for the bits that do require to be re-programmed.

All this in order to only generate a fresh programming pulse to those elementary cells for which the comparison with the data to be programmed have failed.

In accordance with an aspect of the invention, a circuit is provided for identifying an erroneous contents of a memory cell. A device is operable to read the contents of the memory cell after a write cycle. A comparator has a first input that is coupled to the device and operable to receive the contents. The comparator has a second input that is operable to receive a data bit that was to be stored in the cell during the write cycle. The comparator generates on a first output a first signal when the contents is unequal to the data bit, and generates on a second output a second signal when the data bit equals a programmed value.

BRIEF DESCRIPTION OF THE DRAWINGS

The features and advantages of a circuit according to the invention will be apparent from the following detailed description of an embodiment thereof, given by way of example and not of limitation with reference to the accompanying drawings. In the drawings.

DETAILED DESCRIPTION OF THE INVENTION

Figure 1:
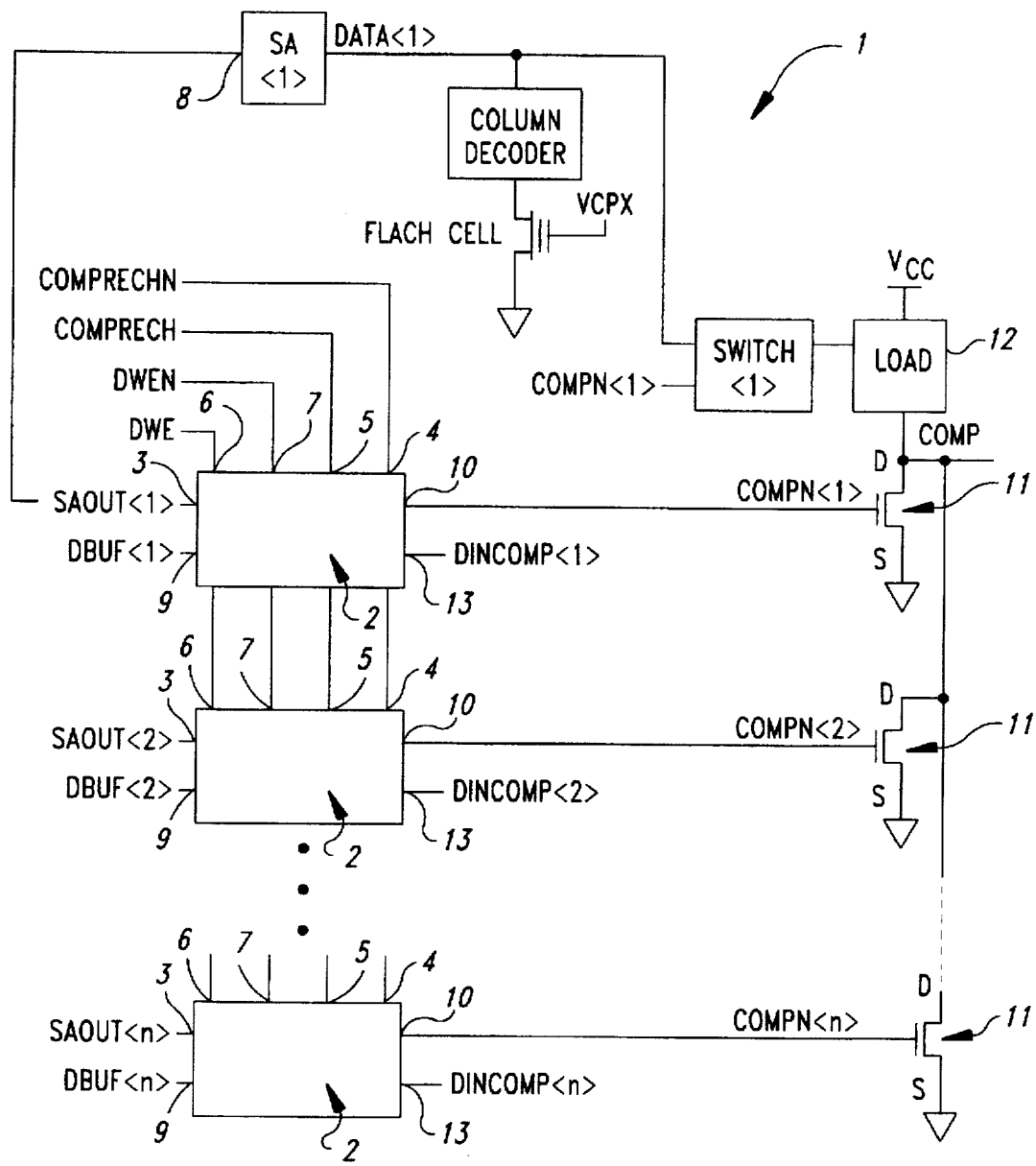
FIG. 1 is a block diagram of a circuit according to the invention.

With reference to FIG. 1, generally and schematically shown at 1 is a circuit embodying this invention, which allows single-bit programming of nonvolatile memory cells, e.g., cells of the "Flash" type, to be performed.

The cells are arranged in matrix form with a plurality of rows and columns, and are included in an electronic circuit which has been integrated on a semiconductor (not shown).

The circuit 1 comprises a comparator 2 having a plurality of inputs and at least two outputs. A first input 3 of the comparator 2 is downstream connected to an output 8 of a sense amplifier SA, i.e., a differential amplifier which is particularly sensitive and operative to read the memory cells on an individual basis.

The structure and operation of a sense amplifier such as SA are described for example in U.S. Pat. No. 5,218,570, which is incorporated by reference herein.

A digital signal SAOUT(n) is received on this input 3.

A second input 5 of the comparator 2 receives a digital control signal denoted by the reference COMPRECH.

Another input 4 of the comparator 2 receives a signal COMPRECHN having a negated logic value if compared with the former signal COMPRECH. That is, COMPRECHN is the complement of COMPRECH.

A fourth input 6 receives a second control signal DWE. A fifth input 7 receives a signal DWEN having a negated logic value if compared with the former signal DWE. That is, DWEN is the complement of DWE.

A latch (not shown) contains a value DBUF(n) corresponding to the data to be programmed into the n-th cell, and is connected to an input 9 of the comparator 2.

A first output 10 of the comparator is connected to the gate terminal of a transistor 11 of the MOS type. More particularly, a plurality of such transistors 11 are arranged in the circuit 1 in such a way that each of them will correspond to one bit of the memory word.

In the embodiment herewith disclosed, the memory word is a sixteen-bit word, whereby sixteen transistors 11 will be connected in parallel with one another to receive a control signal, each from a respective comparator 2.

In one aspect of the invention, these transistors 11 are n-channel types and have respective source terminals S connected to a signal ground, their drain terminals D are connected to a common line COMP. Each gate terminal is connected, on the other hand, to the output 10 of a corresponding one of the comparators 2 to receive a signal COMPN(n).

The aggregate of the transistors 11 can be viewed as a distributed NOR, to be implemented in both static and dynamic logic, whose output is represented by the line COMP.

The line COMP is fed by a supply voltage Vet through a load 12, such as a MOS transistor of the p-channel type.

Produced at a second output 13 of the comparator 2 is a signal DINCOMP(n) which is at a logic high when the n-th bit in the addressed word shows, on comparison by the comparator, to have been programmed incorrectly.

The operation of the circuit according to the invention, having single-bit programming features, will now be described.

When the signal COMPRECH is at a logic high, the output SAOUT(n) from the sense amplifier SA is transferred into the comparator 2. In the meantime, the line COMP is kept pre-charged from the power supply Vcc.

On the other hand, when the signal DWE is at a logic high, the comparator 2 will receive as input the value DBUF(n) corresponding to the data to be programmed. But when the signal COMPRECH is at a logic low, a comparison of the signals DBUF(n) and SAOUT(n) is carried out.

The result of this comparison is a signal DINCOMP(n) which provides an indication of which bits in the memory word should be subjected to an additional programming pulse by activation of the respective program circuits.

In the event of the comparison yielding an unfavorable result, the signal on the line COMP is brought to a logic low, whereas the signal DINCOMP(n) which corresponds to the incorrectly programmed bit is brought to a logic high.

In essence, this signal DINCOMP(n) is assigned the function of enabling the program circuits associated with the cells in the memory word, so that an additional programming pulse is applied to just those cells which have revealed disagreement between the stored and the set data.

A detailed discussion of the internal structure of the comparator 2 may be of assistance for a full appreciation of the features of this invention.

Figure 2:
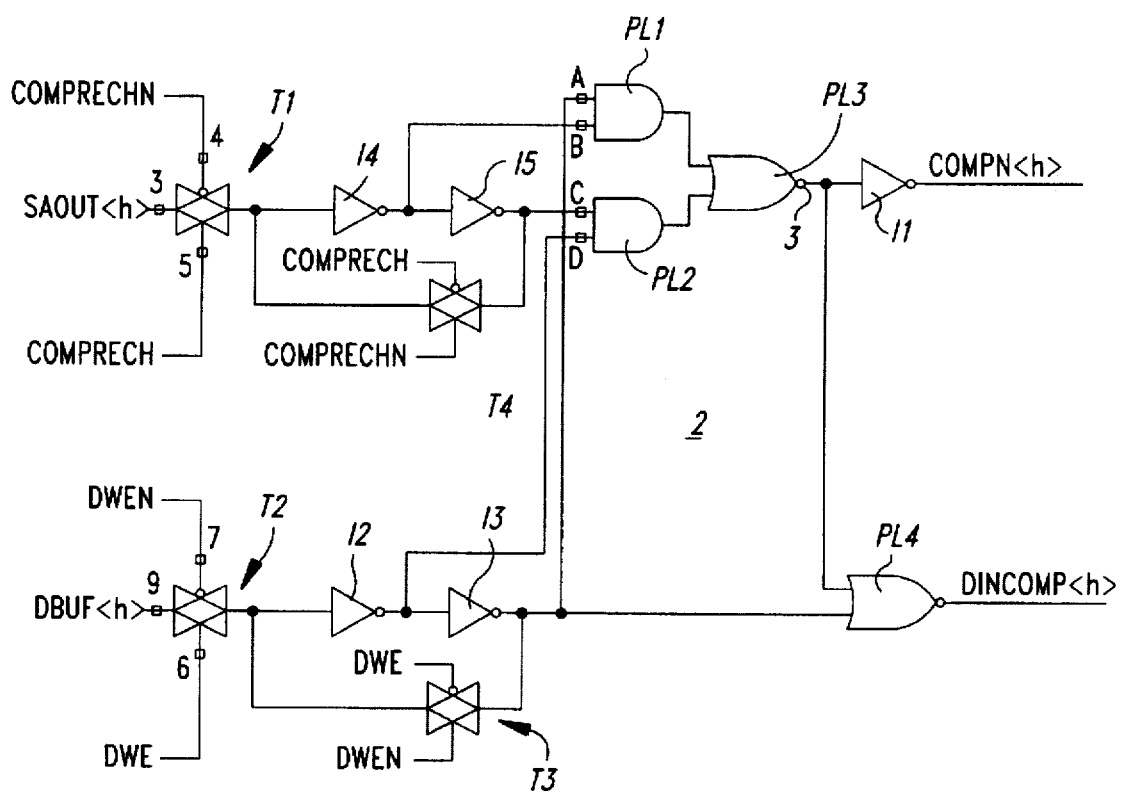
FIG. 2 is a circuit scheme illustrating in greater detail of the features of a portion of the inventive circuit of FIG. 1.

With reference to the example shown in FIG. 2, the comparator comprises two logic gates, PL1 and PL2, of the AND type, having two inputs in parallel with each other. The outputs of these gates are connected to respective inputs of a third logic gate PL3 of the NOR type.

The output O3 of this gate PL3 is connected to an inverter I1 which is connected directly to the gate terminal of one of the MOS transistors 11.

This output O3 of gate PL3 is also connected to an input of a logic NOR gate PL4. The logic gate PL4 has an output at which the signal DINCOMP(n) is produced.

A second input of this gate PL4 receives the signal DBUF(n) through two inverters I2 and I3 in series.

The signal DBUF(n) is applied to the input of the inverter I2 through a bidirectional element, such as a transistor switch T2 controlled by positive-logic DWE and negative-logic DWEN signals.

Connected after the bidirectional element T2 is a further bidirectional element T3, also controlled by the signals DWE and DWEN, which is connected between the input of the inverter I2 and the output of the inverter I3.

The inverter I3 output is also connected to the first input A of the first logic gate PL1, which gate has its second input B connected to the output of an inverter I4.

This inverter I4 receives as input the signal SAOUT(n) through a bidirectional element T1, and will transfer it to the first input C of the second logic gate PL2 through another inverter I5.

The bidirectional element T1 is, for example, a transistor switch controlled by positive-logic COMPRECH and negative-logic COMPRECHN signals.

Connected after the bidirectional element T1 is a further bidirectional element T4, also controlled by the signals COMPRECH and COMPRECHN, which is connected between the input of the inverter I4 and the output of the inverter I5.

The second input D of the second gate PL2 is connected to the output of the inverter I2.

Still referring to FIG. 2, the operation of the comparator 2 is discussed. In a writing phase, the signal DWE is set to a high logic level, i.e., a logic 1, to allow the transfer of the signal DBUF(n) into a latch formed from the elements T2, T3, I2, and I3. The signal DBUF carries the value of the data bit to be programmed into the corresponding memory cell. As soon as the signal DWE is switched to a low logic level, i.e., logic 0, the latch stores the data value carried by DBUF. As shown, the complementary outputs of the latch, i.e., the outputs of I2 and I3, are respectively coupled to the inputs A and D of the logic gates PL1 and PL2, respectively.

After the first writing phase, a reading phase is performed to verify the status or contents of the cell. The cell contents are represented by the signal SAOUT, which is transferred to and stored in a second latch formed from elements T1, T4, I4, and I5. In one embodiment of the invention, the signal SAOUT is transferred when the signal COMPRECH reaches a logic 1 and is latched when the signal COMPRECH returns to a logic 0. As shown, the complementary outputs of the second latch, i.e., the outputs of the inverters I4 and I5, are respectively coupled to the inputs B and C of the logic gates PL1 and PL2, respectively.

The comparator formed by the logic gates PL1, PL2, and PL3 produces an output O3=AB+CD.

Table 1 shows the possible combinations of signals DBUF and SAOUT and the resultant values of O3 and COMPN.

TABLE 1

| DBUF | SAOUT | VERIFY | A | B | C | D | O3 | COMPN |
|------|-------|--------|---|---|---|---|----|-------|
| 0 | 0 | O.K. | 0 | 1 | 0 | 1 | 1 | 0 |
| 0 | 1 | K.O. | 0 | 0 | 1 | 1 | 0 | 1 |
| 1 | 0 | K.O. | 1 | 1 | 0 | 0 | 0 | 1 |
| 1 | 1 | O.K. | 1 | 0 | 1 | 0 | 1 | 0 |

DBUF=0 indicates that a programmed data value should have been written into the memory cell during the write phase.

DBUF=1 indicates that an unprogrammed data value should have been written into the memory cell during the write phase. Thus, in an aspect of the invention where the cell is erased before the write phase, the cell hereby remains in this unprogrammed state during the write phase. VERIFY=O.K. indicates that the verify phase has been given a positive result. The data in the cell is proper. VERIFY=K.O indicates that the verify phase has been given a negative result, the data in the cell is improper.

Therefore, at the end of the writing phase, there are two possibilities. In the first possibility, all the cells have been correctly written to. If this is the case, all the outputs COMPN are at a logic 0, and all the n-channel transistors 11 of FIG. 1 are turned off. Thus, the signal COMP is at a logic 1 to indicate that the writing phase for this word was accurately performed. In the second possibility, one or more cells have been incorrectly written to. The signals COMPN corresponding to the incorrectly written to cells are at a logic 1, and the corresponding n-channel transistors 11 are turned on, forcing the signal COMP to a logic 0 to indicate that there is a need for another writing phase. Typically, where all the memory cells are erased before the writing phase, the vast majority of errors will be that a memory cell that should have been programmed was not. This is due to the fact that the characteristics of a cell may be such that the writing phase was insufficient in, e.g., time or voltage to program the cell. Thus, these cells need to be reprogrammed. Typically, unless there is an error in the writing software, few if any cells will change states if they should not. Instead, the majority of errors occur when the cells should change states but do not.

In one embodiment of the invention, if the value VERIFY=K.O., and the data to be stored is a logic 0 (that is, the memory cell should have been programmed but was not), both inputs of gate PL4 are at a logic 0 and the output of PL4, DINCOMP, is a logic 1. Therefore, the additional writing, i.e., reprogramming phase, will program only those bits for which the corresponding DINCOMP signal is a logic 1.

It will be appreciated from the foregoing discussion that the device of this invention is uncomplicated to use and involves but small circuit area. Further, the particular structure of the comparator 2 allows effective re-programming of just those bits for which a previous writing step has been unsuccessful.

We claim:

1. A circuit for identifying a memory cell having stored therein an incorrect data value, comprising:

a device operable to read said stored data value after a write cycle;

a comparator having a first input coupled to said device and operable to receive said stored data value, having a second input operable to receive a correct value data that was to be stored in said cell during said write cycle, and having a pair of outputs, said comparator operable to generate a first signal on a first of said outputs when said stored data value is unequal to said correct data value and a second signal on said second output in response to said first signal and when said correct data value equals a programmed value.

2. The circuit of claim 1 wherein said device comprises a sense amplifier.

3. The circuit of claim 1 wherein said comparator comprises a storage device coupled to said second input and operable to store said correct data value.

4. A circuit for identifying a memory cell having stored therein an erroneously unprogrammed data value, comprising:

a read device having an input coupled to said memory cell and having an output;

a first signal line that carries a proper data value that was provided to said memory cell for storage;

a second signal line that carries a first signal level if said stored data value equals said proper data value and a second signal level if said stored data value does not equal said proper data value;

a third signal line that carries a third level if said stored data value does not equal said proper data value and said stored data value equals an unprogrammed value; and a comparator having a first input coupled to said output of said read device, a second input coupled to said first signal line, a first output coupled to said second signal line, and a second output coupled to said third signal line.

5. The circuit of claim 4 wherein said comparator comprises:

a first latch having an input coupled to said first input, and having a first pair of outputs;

a second latch having an input coupled to said second input, and having a second pair of output terminals;

a first logic circuit having a first pair of inputs respectively coupled to said first pair of outputs, a second pair of inputs respectively coupled to said second pair of outputs, and an output coupled to said first output of said comparator; and a second logic circuit having a first input coupled to one of said second pair of output terminals, a second input coupled to said output of said first logic circuit, and an output coupled to said second output of said comparator.

6. The circuit of claim 5 further comprising an inverter interposed between said first logic circuit and said first output of said comparator, said inverter having an input coupled to said output of said first logic circuit and an output coupled to said first output of said comparator.

7. The circuit of claim 5 wherein said first logic circuit comprises:

a first AND gate having a pair of inputs respectively coupled to a first output from the first pair of outputs and a second output from the second pair of outputs, and having an output;

a second AND gate having a pair of inputs respectively coupled to a second output from the first pair of outputs and a first output from the second pair of outputs, and having an output; and a NOR gate having first and second inputs coupled to said outputs of said first and second AND gates respectively, and having an output coupled to said output of said first logic circuit.

8. The circuit of claim 5 wherein said second logic circuit comprises a NOR gate.

9. A method for identifying an erroneous content of a memory cell after writing a data value to said memory cell, comprising:

reading said content;

comparing said content with said data value;

generating a first signal if said content is unequal to said data value; and generating a second signal if said content is unequal to said data value and if said content should equal a programmed data value.

10. The method of claim 9 further comprising programming said memory cell in response to said second signal.

11. A circuit for single-bit programming a memory word stored in a plurality of elementary cells, in non-volatile memory electronic devices, being of a type which comprises, for each elementary memory cell included in said memory word, at least one comparator having a first input connected to a read circuit, for reading the contents of said memory word, and a second input receiving data corresponding to a bit to be stored into said memory word, at least one transistor driven from a first output of the comparator to indicate a need to have said memory word re-programmed, and at least one logic gate incorporated to the comparator to produce, at a second output, a signal enabling an n-th cell in said memory word whose programming has been found incorrect by the comparator to be re-programmed.

12. A circuit according to claim 11, characterized in that it comprises first and second logic gates of the AND type connected between said first input of the comparator and said first output, and a third logic gate of the NOR type connected to the outputs of said first and second logic gates.

13. A circuit according to claim 12, characterized in that it comprises a first unidirectional element controlled by an enable signal and connected between said first input and an input of the second logic gate.

14. A circuit according to claim 12, characterized in that it comprises a fourth logic gate of the NOR type having a first input connected to the output of said third logic gate and a second input connected to said second input of the comparator.

15. A circuit according to claim 14, characterized in that it comprises a second unidirectional element controlled by a second enable signal and connected between said second input of the comparator and the second input of the fourth logic gate.

16. A circuit according to claim 13, characterized in that inverters are provided in series between said first unidirectional element and the input of the second logic gate.

17. A circuit according to claim 16, characterized in that a further unidirectional element, controlled by an enable signal which is negated with respect to that for the first unidirectional element, is provided in parallel with said serially connected inverters.

18. A circuit according to claim 12, characterized in that a second input of the second logic gate is connected to said second input of the comparator through at least one inverter.

* * * * *